(12) United States Patent
Sterns et al.

(10) Patent No.: US 9,823,284 B2
(45) Date of Patent: Nov. 21, 2017

(54) ULTRA-WIDE BAND MEASUREMENT BRIDGE

(71) Applicant: Rohde & Schwarz GmbH & Co. KG, Munich (DE)

(72) Inventors: Michael Sterns, Nuremberg (DE); Martin Leibfritz, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 151 days.

(21) Appl. No.: 14/398,418

(22) PCT Filed: May 3, 2013

(86) PCT No.: PCT/EP2013/059260
§ 371 (c)(1),
(2) Date: Oct. 31, 2014

(87) PCT Pub. No.: WO2013/164453
PCT Pub. Date: Nov. 7, 2013

(65) Prior Publication Data
US 2015/0130554 A1 May 14, 2015

(30) Foreign Application Priority Data
May 3, 2012 (DE) .................. 10 2012 207 341

(51) Int. Cl.
*G01R 27/26* (2006.01)
*G01R 27/06* (2006.01)
(Continued)

(52) U.S. Cl.
CPC ............ *G01R 27/06* (2013.01); *G01R 27/04* (2013.01); *G01R 27/28* (2013.01); *G01R 27/32* (2013.01);
(Continued)

(58) Field of Classification Search
CPC ..... G01N 22/00; G01R 27/26; G01R 27/2605
(Continued)

(56) References Cited

U.S. PATENT DOCUMENTS 4,000,458 A * 12/1976 Miller .................. G01N 27/023
324/236
4,588,970 A * 5/1986 Donecker .............. G01R 27/06
324/638

(Continued)

FOREIGN PATENT DOCUMENTS

CZ         2009-770 A3    12/2010
DE       40 17 412 A1     1/1991
(Continued)

OTHER PUBLICATIONS

International Search Report for corresponding International Application No. PCT/EP2013/059260, dated Oct. 23, 2013, 5 pages.
(Continued)

*Primary Examiner* — Son Le
*Assistant Examiner* — Akm Zakaria
(74) *Attorney, Agent, or Firm* — Ditthavong & Steiner, P.C.

(57) ABSTRACT

A measuring bridge (1) provides a first matching pad (2), a second matching pad (3) and a third matching pad (4), wherein all matching pads (2, 3, 4) comprise at least three resistors ($2_1$, $2_2$, $2_3$, $3_1$, $3_2$, $3_3$, $4_1$, $4_2$, $4_3$) which are arranged in a T-structure. A second resistor ($3_2$) of the second matching pad (3) is connected to a second resistor ($2_2$) of the first matching pad (2), and a third resistor ($4_3$) of the third matching pad (4) is connected to a third resistor ($2_3$) of the first matching pad (2). A second resistor ($4_2$) of the third matching pad (4) can be connected to a device under test (7). A third resistor ($3_3$) of the second matching pad (3) can be connected to a calibration standard (5), and a first resistor (Continued)

($3_1$, $4_1$) of the second and the third matching pad (3, 4) are connected in each case to a signal input of an element (11) which suppresses a common-mode component on its two signal inputs.

15 Claims, 10 Drawing Sheets

(51) Int. Cl.
    *G01R 27/04*     (2006.01)
    *G01R 27/32*     (2006.01)
    *G01R 27/28*     (2006.01)
    *H03H 7/42*     (2006.01)
    *H01P 5/12*     (2006.01)
    *H01P 5/20*     (2006.01)

(52) U.S. Cl.
    CPC ............... *H03H 7/42* (2013.01); *H01P 5/12* (2013.01); *H01P 5/20* (2013.01)

(58) Field of Classification Search
    USPC ........................................................ 324/648
    See application file for complete search history.

(56) References Cited

U.S. PATENT DOCUMENTS

| | | | |
|---|---|---|---|
| 4,962,359 A | | 10/1990 | Dunsmore |
| 6,690,177 B2* | | 2/2004 | Dalebroux ............... H03H 7/38 |
| | | | 324/637 |
| 7,126,347 B1* | | 10/2006 | Bradley ................. G01R 27/04 |
| | | | 324/648 |
| 9,459,648 B2* | | 10/2016 | Kanamaru .......... H04L 25/0276 |
| 2004/0090238 A1* | | 5/2004 | Hayden .............. G01R 1/06738 |
| | | | 324/754.07 |
| 2006/0197626 A1 | | 9/2006 | Ehlers et al. |
| 2008/0018344 A1* | | 1/2008 | Jachim ................... G01R 27/32 |
| | | | 324/610 |
| 2009/0295495 A1 | | 12/2009 | Lui et al. |
| 2012/0171967 A1* | | 7/2012 | Zampardi, Jr. ........ H01C 1/012 |
| | | | 455/73 |
| 2013/0214762 A1* | | 8/2013 | Leibfritz ................ G01R 27/32 |
| | | | 324/98 |

FOREIGN PATENT DOCUMENTS

| | | |
|---|---|---|
| DE | 10 2006 005 040 A1 | 8/2007 |
| DE | 10 2007 021 899 A1 | 10/2008 |
| EP | 0 449 744 A1 | 10/1991 |
| EP | 0 554 021 A2 | 8/1993 |
| GB | 1182733 A | 3/1973 |
| WO | 2007090564 A1 | 8/2007 |

OTHER PUBLICATIONS

Rehner et al, "A Novel DGS-Marchand Balun From 40 to 80 GHz With IF-TAP for Mixer Design", 1-4244-0688-9/07, IEEE, Dated 2007, pp. 1753-1756.

Notification of Transmittal of Translation of the International Preliminary Report on Patentability; International Preliminary Report on Patentability; Written Opinion of the International Searching Authority for corresponding International Application No. PCT/EP2013/059260, dated Nov. 13, 2014, 15 pages.

\* cited by examiner

ULTRA-WIDE BAND MEASUREMENT BRIDGE

CROSS-REFERENCE TO RELATED APPLICATION

The present application is a national phase application of PCT Application No. PCT/EP2013/059260, filed May 3, 2013, and claims priority to German Application No. DE 10 2012 207 341.8, filed on May 3, 2012, the entire contents of which are herein incorporated by reference.

BACKGROUND OF THE INVENTION

Field of the Invention

The invention, according to the various embodiments described herein, relates to a measuring bridge which can be used, for example, in a network analyser in order to supply an excitation signal to a device under test and at the same time to supply reflections of the device under test to an electronic measuring device, and a balun which can be inserted into the measuring bridge, wherein the measuring bridge provides a very high bandwidth.

Discussion of the Background

In addition to investigating reflections of a device under test, a measuring bridge can also be used to investigate the transmission behaviour of the device under test more precisely. In this case, a connection of the device under test is connected to a first port of the network analyser, whereas a second connection of the device under test is connected to a second port of the network analyser. An excitation signal is generated in the network analyser and supplied to the device under test at its first terminal. The signal transmitted by the device under test is output, for example, at the second connection, and supplied to the second port of the network analyser. This second port is also connected to a measuring bridge in order to supply the transmitted signal to the electronic measuring device, which preferably measures it according to magnitude and phase. In this context, it is important that the bandwidth of the usable frequency range is as large as possible, extending therefore over several decades, which again requires a measuring bridge which provides a high directivity at low frequencies and also at high frequencies.

A measuring comprises a resistive bridge for a low-frequency range and a hybrid coupler for a high-frequency range, wherein switches are provided to switch between these two units. It is disadvantageous that, as a result of the different component groups which are used for different frequencies, the construction of the measuring bridge is complicated and requires the running of extensive calibration routines.

SUMMARY OF THE INVENTION

According to one embodiment, a measuring bridge which can be manufactured more simply and operated over a very broad bandwidth and a balun which can be used in this context are herein provided.

The measuring bridge, according to another embodiment, provides a first matching pad, a second matching pad and a third matching pad, wherein all matching pads comprise at least three resistors which are arranged in a T-structure, wherein, in each case, a second resistor of the second matching pad is connected to a second resistor of the first matching pad, and a third resistor of the third matching pad is connected to a third resistor of the first matching pad, wherein a second resistor of the third matching pad can be connected to a device under test.

It is advantageous that three symmetrical matching pads are used which comprises at least three resistors which are arranged in a T-structure, because, as a result, in the case of a balanced measuring bridge, only a common-mode signal is present at the output of two matching pads.

In yet another embodiment, further advantage is achieved with the measuring bridge if a third resistor of the second matching pad can be connected to a calibration standard, and if a first resistor of the second and the third matching pad is connected in each case to a signal input of an element which suppresses a common-mode component on both of its signal inputs. Here, it is particularly advantageous that the signals are supplied to such an element at the output of the second and the third matching pad. For the case that the measuring bridge is balanced, no voltage can be measured at the output of this element. For the case that the measuring bridge is not balanced, a further odd-mode signal may be superposed on the common-mode signal, which is not suppressed by the element and can therefore be measured at the output of the element. This is the case if the terminal impedance of the device under test differs from the terminal impedance of the calibration standard.

Furthermore, according to another embodiment, an advantage is achieved with the measuring bridge if the resistors of the first, second and third matching pad are embodied as thin-film resistors on a substrate, for example, a ceramic or a quartz substrate or another carrier medium. These resistors can thus be trimmed by means of a laser to their exact value, wherein, at the same time, by contrast with discrete components, the parasitic capacitances and inductances of these resistors are restricted to a minimum.

According to an exemplary embodiment, it is particularly advantageous if the measuring bridge comprises a bias unit which is connected to the second resistor of the third matching pad, and if the measuring bridge comprises a dummy-bias unit which is connected to the third resistor of the second matching pad, and if the dummy-bias unit influences the measuring bridge in the same manner as the bias unit, so that the measuring bridge is constructed in a symmetrical manner. In this context, it is particularly advantageous that devices under test which require a bias for their operation can also be tested with such a measuring bridge. Accordingly, the line branch towards the device under test provides the same electrical properties as the line branch to the calibration standard. The dummy-bias unit preferably provides the same components, with the difference that it need not necessarily provide a bias.

According to another embodiment, the element suppressing the common-mode component can be formed within the measuring bridge by a balun, wherein the balun comprises a first portion which contains a substrate on the upper side of which a first signal line and at least one second signal line are guided and on the lower side of which a thin-film resistor layer is embodied beneath the signal lines. In this context, it is particularly advantageous that such a thin-film resistor layer, which is embodied directly beneath the signal lines, ensures that the common-mode component is more strongly attenuated than the odd-mode component. A balun constructed in this manner is suitable for operation up to very high frequencies.

A further advantage is achieved, in accordance with another embodiment, if the balun comprises a second portion, wherein the second portion provides a coaxial line of which the inner conductor is connected to the first signal line and of which the outer conductor is connected at a first end of the coaxial line to the second signal line, and wherein at least one first ferrite surrounds the coaxial line. The use of such a ferrite which surrounds the coaxial line means that the balun also suppresses the common-mode component reliably even at very low frequencies.

In yet another embodiment, an advantage is achieved with the balun if the thin-film resistor layer provides a DGS structure (Defective Ground Structure) in the first portion, so that the thin-film resistor layer is split into two mutually separate thin-film resistor layers, wherein the width of the DGS structure should be optimised corresponding to the substrate material used, and wherein the latter is embodied directly between the two signal lines on the lower side of the substrate. Such a DGS structure has the advantage that the odd-mode signal is still attenuated considerably less strongly than the common-mode signal, so that the common-mode suppression of the balun is increased.

In one embodiment, further advantage of the balun is also achieved if the outer conductor of the coaxial line is connected at a second end to the reference ground and/or if the balun provides a compensation line, which preferably comprises a wire and of which the first end is connected to the first signal line. Such a compensation line ensures that the inner conductor sees the same inductance with reference to the housing ground as the outer conductor, and the bridge is thus also balanced at low frequencies if the termination impedance of the device under test is equal to the termination impedance of the calibration standard.

Finally, in one embodiment, an advantage is achieved with the balun if the end of the coaxial line which is distant from the first portion of the balun is connected to a first cup core, wherein the first cup core comprises a coaxial line coiled within a ferrite, and/or if the compensation line is connected to a second cup core, wherein the second cup core comprises a line, especially a wire, coiled within a ferrite, and wherein the second cup core provides the same electrical properties as the first cup core. Such a cup core means that the common-mode component can also be reliably suppressed for even lower frequencies. A measuring bridge in which such a balun is used can consequently be operated over a very broad bandwidth.

BRIEF DESCRIPTION OF THE DRAWINGS

Various exemplary embodiments of the invention are described in the following by way of example with reference to the drawings. Identical subject matters provide the same reference numbers. In detail, the corresponding Figs. of the drawings show:

FIG. 1A shows an exemplary embodiment of an equivalent circuit diagram of the measuring bridge 1. The measuring bridge 1 provides a first matching pad 2, a second matching pad 3 and a third matching pad 4. The first matching pad 2 comprises at least three resistors $2_1$, $2_2$, $2_3$, which are arranged in a T-structure. The second matching pad 3 also comprises at least three resistors $3_1$, $3_2$, $3_3$, which are also arranged in a T-structure. The same applies for the third matching pad 4 which also comprises at least three resistors $4_1$, $4_2$, $4_3$ which are arranged in a T-structure. In this context, the second resistor $2_2$ of the first matching pad 2 is connected to the second resistor $3_2$ of the second matching pad 3. The third resistor $2_3$ of the first matching pad 2 is connected to the third resistor $4_3$ of the third matching pad 4.

Figure 1A:
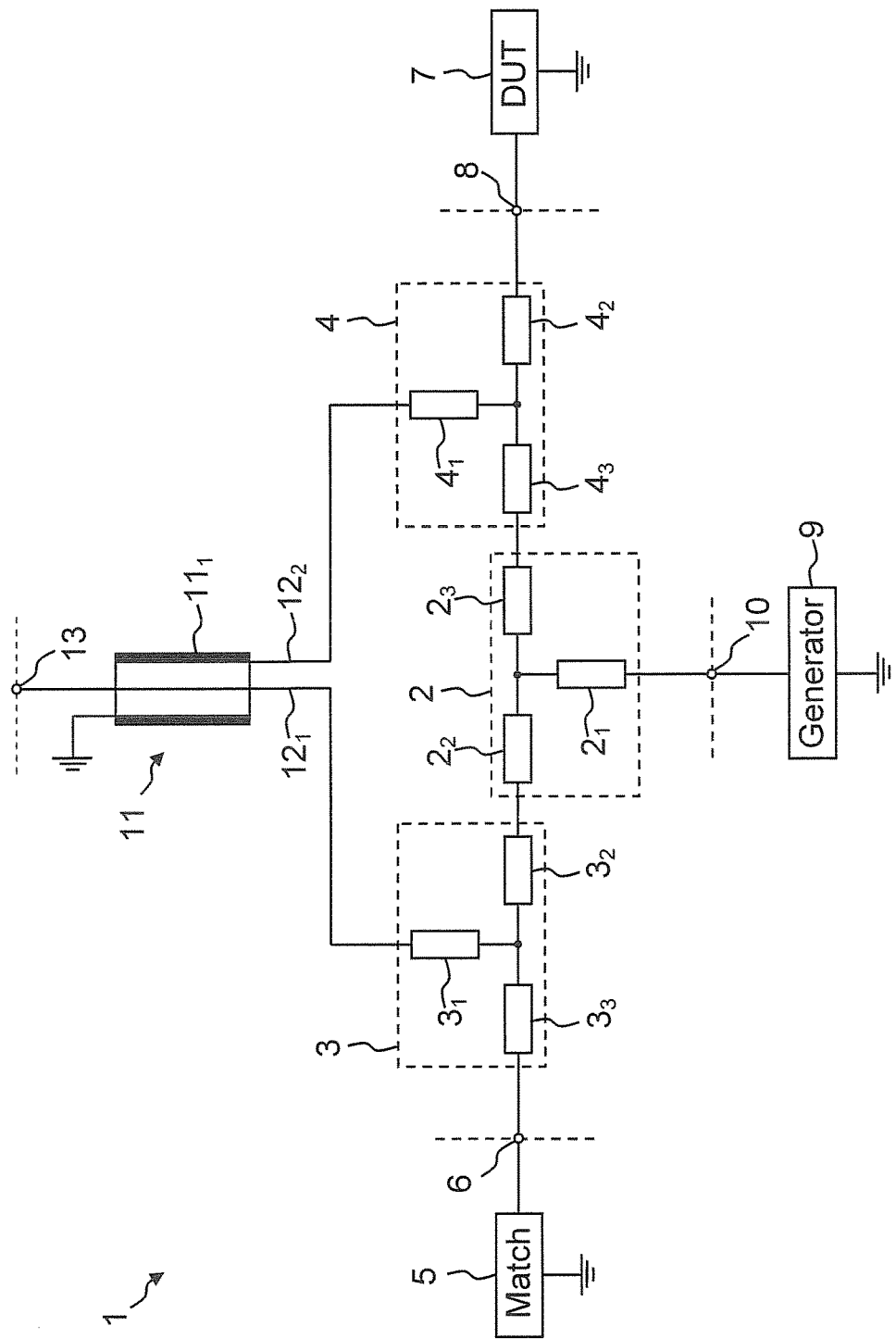
FIG. 1A an exemplary embodiment of an equivalent circuit diagram of the measuring bridge.

The third resistor $3_3$ of the second matching pad 3 is connected to a calibration standard 5. This calibration standard 5 may be embodied either directly within the measuring bridge 1 or it can be connected to the measuring bridge 1. In the latter case, the measuring bridge 1 provides a first connector 6 which can be, for example, a connector socket, to which the separate calibration standard 5 is connected, especially screw-connected.

At the other side, the second resistor $4_2$ of the third matching pad 4 is connected to the device under test 7 to be measured. In this context, the device under test 7 is preferably screw-connected to a second connector 8, wherein the second connector 8 is preferably embodied as a connector socket and connected to the second resistor $4_2$ of the third matching pad 4.

The first resistor $2_1$ of the first matching pad 2 is connected to a signal generator 9. This signal generator 9 can be embodied within a network analyser and connected via a third connector 10 to the first resistor $2_1$ of the first matching pad 2. The third connector 10 is also preferably a connector socket. However, it is also possible for the measuring bridge 1 to be integrated directly as a plug-in card within a network analyser, so that the third connector 10 is only a type of plug contact or inter-substrate connector.

The resistors of the first matching pad 2, the second matching pad 3 and the third matching pad 4 may be selected in such a manner that the signal generator 9 sees a matched load. Furthermore, in the direction of the calibration standard 5 (Match), the second matching pad 3 must provide an impedance which corresponds to that of the calibration standard 5, so that no further reflections occur. The same also applies for the third matching pad 4, of which the resistors are selected in such a manner that, with a device under test 7 connected which provides the same impedance as the calibration standard 5, no additional reflections occur. For a 50 ohm system, it is the case, for example, that all resistors in the first matching pad 2, the second matching pad 3 and the third matching pad 4, provide a resistance value of approximately 16.78 ohms.

Furthermore, the first resistor $3_1$ of the second matching pad 3 and the first resistor $4_1$ of the third matching pad 4 is connected to an element 11 which suppresses a common-mode component on its two signal inputs. The element 11 suppressing the common-mode component in the exemplary embodiment from FIG. 1A is a balun $11_1$. It is clearly evident that the first signal line $12_1$ connects the inner conductor of the balun $11_1$ to the first resistor $3_1$ of the second matching pad 3. At the other side, a second signal line $12_2$ connects the first resistor $4_1$ of the third matching pad 4 to an outer conductor of the balun $11_1$. The balun $11_1$ can be constructed, for example, very simply from a coaxial cable which is surrounded by ferrites. The end of the balun $11_1$ facing away from the measuring bridge 1 is connected to a fourth connector 13 to which the electronic measuring device of the network analyser, especially various mixer units and/or analog-digital converters, are connected. The outer conductor of this end of the balun $11_1$ is therefore connected to the reference ground. The balun $11_1$ converts a differential signal into a ground-referenced signal.

For the case that the device under test 7 terminates the connection between the second resistor $4_2$ and the device under test 7 in the same manner as the calibration standard 5, the signals on the first signal line $12_1$ and the second signal line $12_2$ are of equal magnitude in their amplitude and in phase. The balun $11_1$ causes this common-mode component to be suppressed, so that no voltage relative to the reference ground can be measured at the fourth connector 13. Something different occurs if the second connector 8 is not terminated in the same manner by the device under test 7 as by the calibration standard 5. In this case, the signals on the first signal line $12_1$ and the second signal line $12_2$ are not exactly identical, so that the odd-mode component can be measured relative to the reference ground at the fourth connector 13.

This construction allows the reflection behaviour of the device under test 7 to be measured without difficulty. As already explained, the calibration standard 5 can also be arranged within the measuring bridge 1, so that the first connector 6 is not required. In this case, however, the measuring bridge 1 provides a slight imbalance, which must be determined by means of a calibration process, because the device under test must continue to be connected via the second connector 8 to the measuring bridge 1. In order to realise the maximum possible bandwidth, the third resistor $3_3$ of the second matching pad 3 may therefore preferably be connected to a first connector 6. In this context, the first connector 6 should provide the same electrical properties as the second connector 8. The attainable insulation between the generator path (signal generator 9) and measurement path (connector 13) is accordingly determined by how well the connection for the device under test 7 can be balanced via the calibration standard 5 in the case of "match".

As will be explained later, the resistors of the first, second and third matching pad 2, 3, 4 are preferably thin-film resistors which are embodied on a substrate 25, for example, a ceramic or a quartz substrate or another suitable carrier material. If it is directly integrated in the measuring bridge 1, the calibration standard 5 can also be realised in the form of one or more thin-film resistors.

Figure 1B:
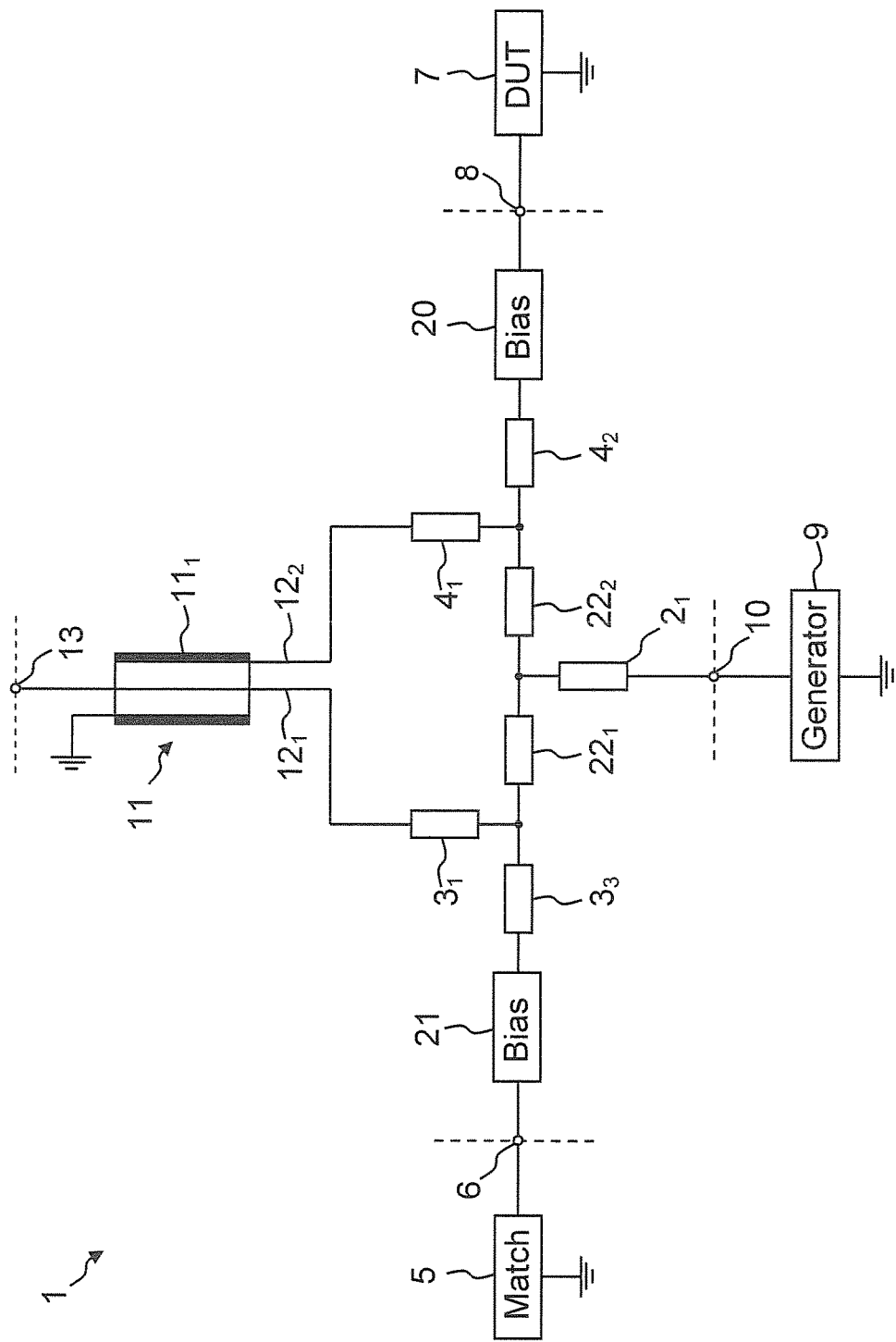
FIG. 1B a further exemplary embodiment of an equivalent circuit diagram of the measuring bridge.

FIG. 1B shows a further exemplary embodiment of an equivalent circuit diagram of a measuring bridge 1, wherein a bias voltage can be supplied to the device under test 7. This is achieved via a so-called bias unit 20. The bias unit 20 provides an adjustable direct current decoupled from the high-frequency at the second connector 8 to which the device under test 7 is connected. The directivity attainable with the measuring bridge 1 is generally impaired by the insertion of such a bias unit 20. To compensate the influences of the bias unit 20 on the directivity, a dummy-bias unit 21 may be added to the measuring bridge at the side of the calibration standard 5. In terms of circuit technology, the construction of this dummy-bias unit 21 is the same as the construction of the bias unit 20. However, the difference is that the dummy-bias unit 21 does not feed any direct current into the calibration standard 5. The measuring bridge 1 is accordingly once again converted into a symmetrical condition, because changes in the phase position caused by the bias unit 20 are also caused in the calibration standard 5 by the dummy-bias unit 21.

A further difference between the exemplary embodiment from FIG. 1A and the exemplary embodiment from FIG. 1B is that the second resistor $2_2$ of the first matching pad 2 and the second resistor $3_2$ of the second matching pad 3 have been combined to form a first equivalent resistor $22_1$. For the 50 ohm system, this equivalent resistor provides a value of approximately 33.56 ohms. Furthermore, the third resistor $2_3$ of the first matching pad 2 and the third resistor $4_3$ of the third matching pad 4 have been combined to form a second equivalent resistor $22_2$. This second equivalent resistor $22_2$ also provides a value of approximately 33.56 ohms for the 50 ohm system. The remainder of the functioning of the measuring bridge 1 from FIG. 1B corresponds to the functioning of the measuring bridge 1 shown in FIG. 1A, so that with regard to the other components, reference is made to the deliberations relating to FIG. 1A.

Figure 1C:
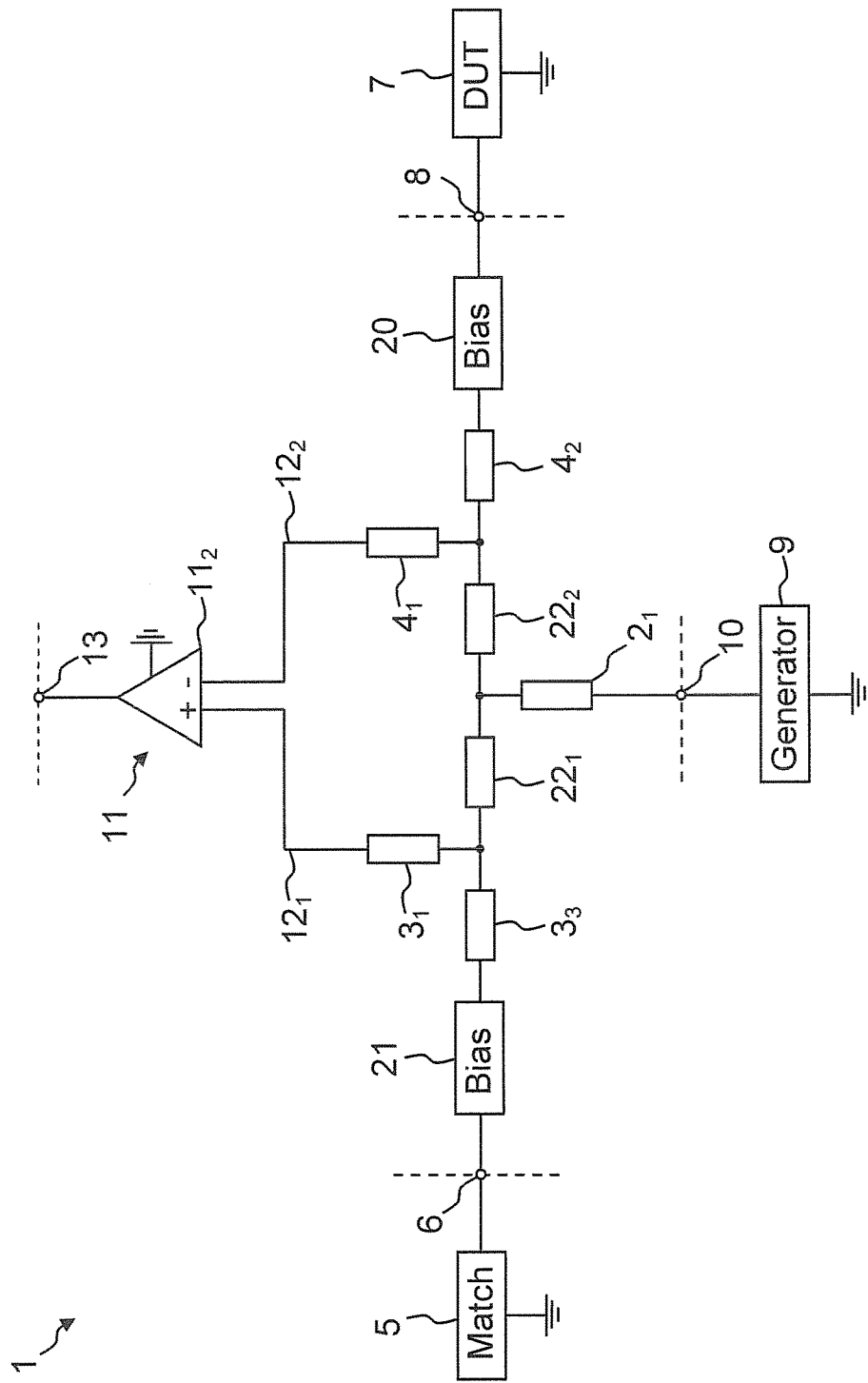
FIG. 1C a further exemplary embodiment of an equivalent circuit diagram of the measuring bridge.

FIG. 1C shows a further exemplary embodiment of an equivalent circuit diagram of the measuring bridge 1, wherein a differential amplifier $11_2$ has been used for the common-mode-suppressing element $11_1$. However, this differential amplifier $11_2$ must provide a sufficiently high common-mode suppression. In this manner, the spatial arrangement of the measuring bridge 1 can be reduced. However, by contrast with the use of a balun $11_1$, the upper threshold frequency is significantly lower when using a differential amplifier $11_2$. Accordingly, differential amplifiers $11_2$ which provide a sufficiently high common-mode suppression, so far only up to an upper frequency range of approximately 5 GHz, are suitable. The remaining circuit structure from FIG. 1C corresponds to the circuit structure from FIG. 1B and FIG. 1A, for which reason reference is made in the following to the previous part of the description.

Figure 2A:
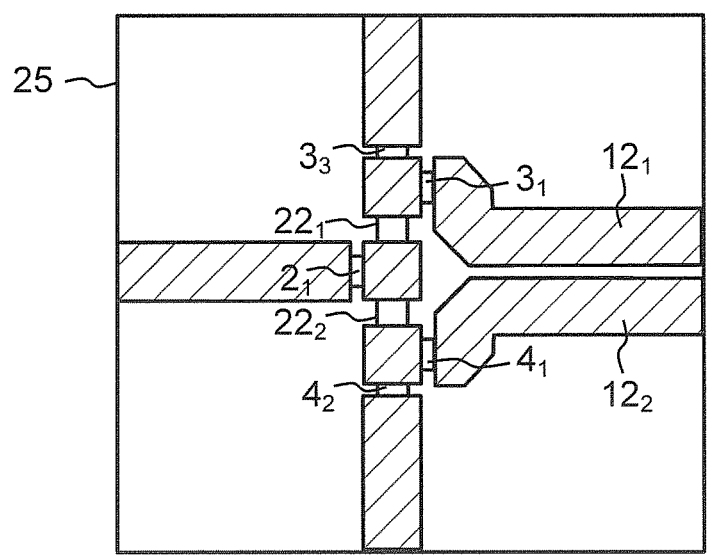
FIG. 2A an exemplary embodiment for the realisation of three matching pads for the measuring bridge.

FIG. 2A shows an exemplary embodiment for the realisation of the three matching pads 2, 3, 4 of the measuring bridge 1. In this context, the measuring bridge 1 is realised using thin-film technology based on microstrip lines. The first resistor $3_1$ and the third resistor $3_3$ of the second matching pad 3 and the first resistor $4_1$ and the second resistor $4_2$ of the third matching pad 4 and the first resistor $2_1$ of the first matching pad 2 are clearly recognisable.

As already explained with reference to FIG. 1B, the second resistor $3_2$ of the second matching pad 3 and the second resistor $2_2$ of the first matching pad 2 may be combined to form a first equivalent resistor $22_1$. The same also applies for the third resistor $2_3$ of the first matching pad 3 and the third resistor $4_3$ of the third matching pad 4, which may be combined to form the second equivalent resistor $22_2$.

These resistors are thin-film resistors which can be trimmed to their nominal value by means of a laser.

Accordingly, the measuring bridge 1 may be embodied on a substrate 25, for example, on a ceramic 25 or on a quartz substrate 25 or another suitable carrier medium 25. The parasitic losses of a ceramic carrier are significantly lower at high frequencies than those of the known synthetic materials which are used in printed circuit boards.

Figure 2B:
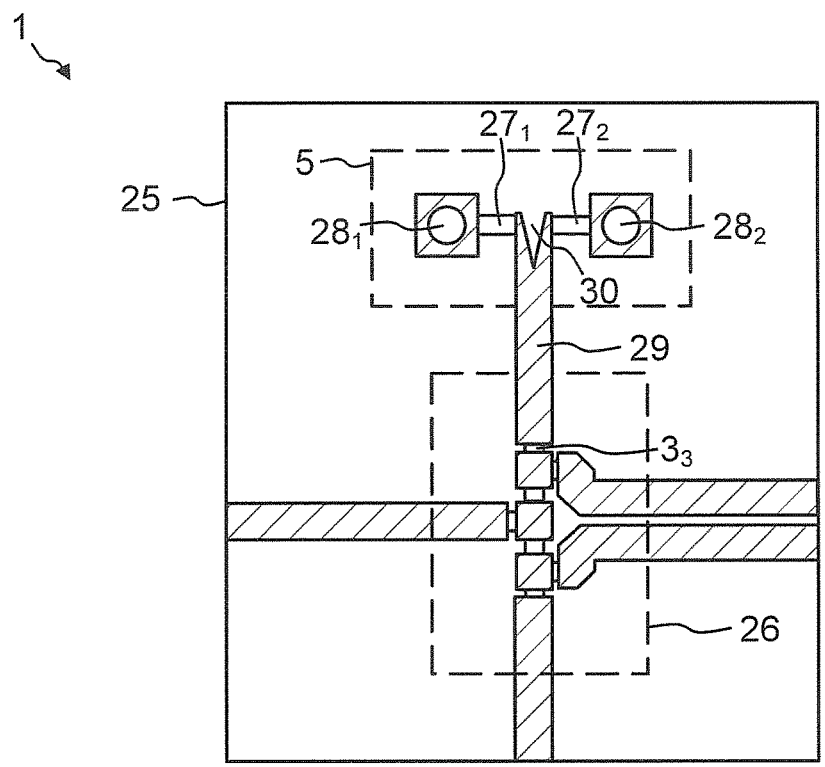
FIG. 2B an exemplary embodiment for the realisation of a calibration standard of the measuring bridge.

FIG. 2B shows an exemplary embodiment for the realisation of a calibration standard 5 which is embodied directly on the measuring bridge 1. It is clearly evident that a first region 26 enclosed by a dashed-line in FIG. 2B contains the excerpt from FIG. 2A. With reference to the first region 26 enclosed by a dashed-line, reference is made to the parts of the description relating to FIG. 2A. Especially at low frequencies, when the phase rotation of the supply lines and the influences of the transitions for the coupling of the device under test 7 are negligible, the calibration standard 5 can be balanced by a simple 50 ohm resistor. In FIG. 2B, this calibration standard 5 is balanced by two 100-ohm thin-film resistors $27_1$, $27_2$, which are each connected through a via $28_1$, $28_2$ to the reference ground on the rear side of the substrate 25, that is, on the rear side of the carrier material 25 and are accordingly connected in parallel. These two 100-ohm thin-film resistors $27_1$, $27_2$ can also be trimmed to their exact nominal value by means of a laser. Furthermore, a conductor track 29 is shown which connects the third resistor $3_3$ of the second matching pad 3 to the two 100-ohm thin-film resistors $27_1$, $27_2$. This conductor track 29 provides a V-shaped recess 30 at its end facing towards the calibration standard 5. Accordingly, the current flow is not guided to the end, thereby reducing the capacitive scattering field.

Figure 2C:
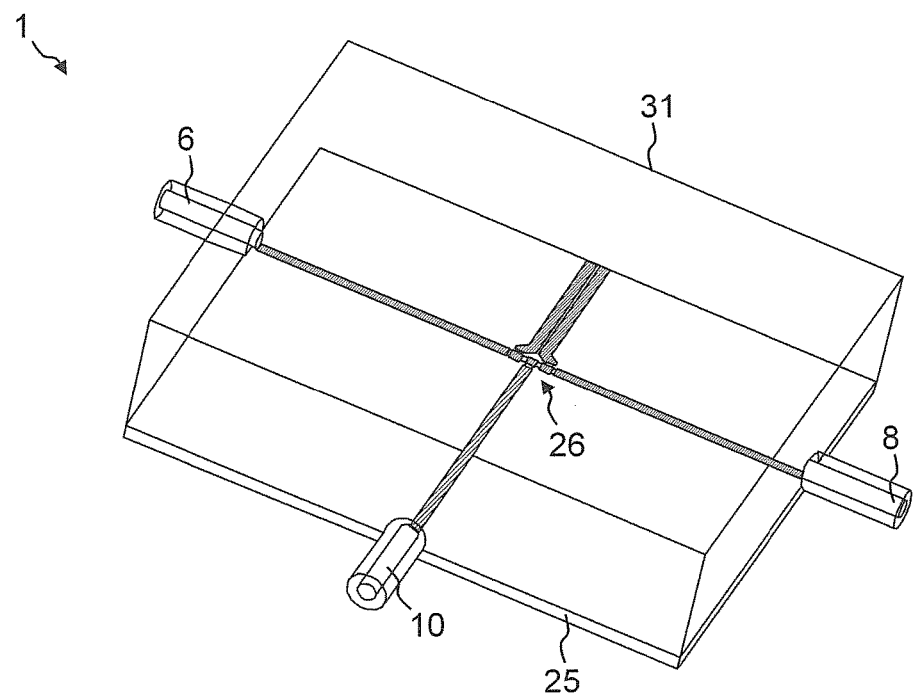
FIG. 2C an exemplary embodiment of the measuring bridge according to the invention which is suitable for connection to a separate calibration standard.

FIG. 2C shows an exemplary embodiment of the measuring bridge 1 which is suitable for connection to a separate calibration standard 5. The region 26 from FIG. 2B which contains the three matching pads 2, 3, 4, as was described with reference to FIG. 2A, is clearly recognisable in the centre of FIG. 2C. Furthermore, the measuring bridge 1 from FIG. 2C provides a first connector 6, a second connector 8 and a third connector 10. The connectors 6, 8, 10 can be connector sockets. The separate calibration standard 5 can be screwed to the first connector 6, whereas the second connector 8 is connected to the device under test 7. As already explained, the first connector 10 can be connected to the signal generator 9. It is important that the first connector 6 provides the same electrical properties as the second connector 8. This means that, like the attenuation of the signal in the two connectors 6, 8, the phase rotations which are caused by the first connector 6 and the second connector 8 may be be approximately identical in magnitude. By preference, the third connector 10 also provides the same electrical properties. It is clearly recognisable that the measuring bridge 1 also provides a housing 31 in addition to the substrate 25. This housing 31 is preferably made from a conducting metal, such as aluminium, and prevents interference radiation from being coupled into the measuring bridge 1.

Figure 3:
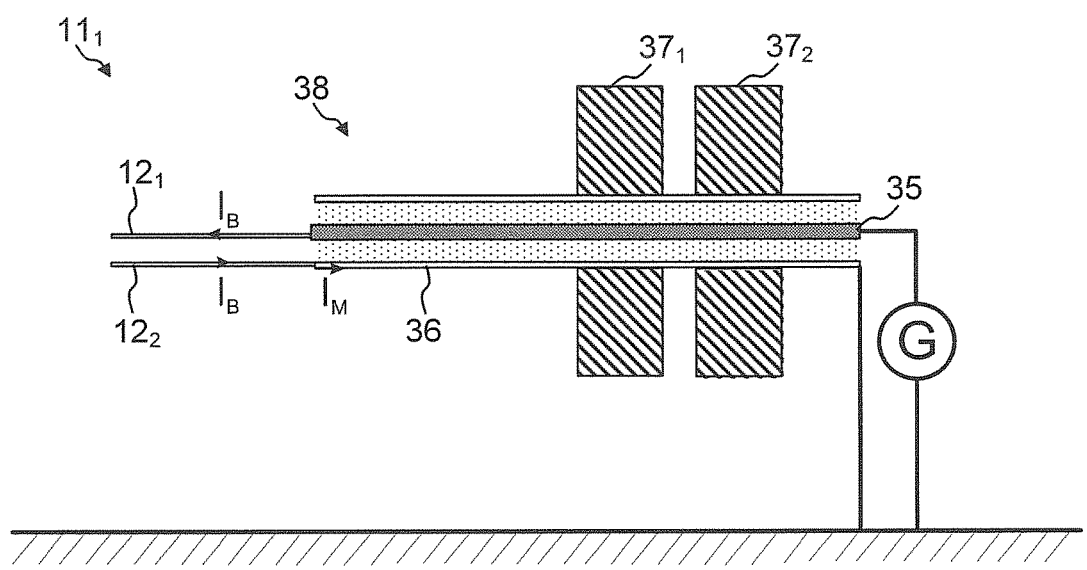
FIG. 3 an exemplary embodiment of a chocked balun.

FIG. 3 shows an exemplary embodiment of a chocked balun $11_1$. As already explained with reference to FIG. 1A, the first signal line $12_1$ is connected to the inner conductor 35 of the balun $11_1$, whereas the second signal line $12_2$ is connected to the outer conductor 36 of the balun $11_1$. The balun $11_1$ from FIG. 3 has a coaxial construction. In this context, the inner conductor 35 is radially surrounded by an outer conductor 36. In the exemplary embodiment from FIG. 3, two ferrites $37_1$ and $37_2$ are also present, which radially surround the outer conductor 36. The interfering sheath currents $I_M$ on the outer conductor 36 are suppressed with the assistance of the ferrites $37_1$, $37_2$. As already explained, this interfering sheath current $I_M$ which would lead to an unbalanced signal component at the output of the balun $11_1$ is suppressed by the ferrites $37_1$, $37_2$ on the sheath of the coaxial line, so that the same current $I_B$ flows in the two output lines 35, 36 in opposite directions.

The ferrites $37_1$, $37_2$ are preferably embodied as ferrite rings which can have a different length and a different size and can be made from different ferrite materials. These ferrites $37_1$, $37_2$ can be arranged at different distances on the coaxial conductor. The sequence and arrangement of the ferrites $37_1$, $37_2$ is guided by the frequency range to be covered and must be matched from case to case. The matching can be implemented in such a manner that the first connector 6 is connected to the calibration standard 5 and also the second connector 8 is connected to a known calibration standard 5. Via the signal generator 9, a signal is fed to the measuring bridge 1 via the third connector 10. The ferrites are then displaced on the outer conductor 36 until the smallest possible voltage minimum is measured at the fourth connector 13. In the case of ideal components, this voltage would be equal to 0.

However, with increasing frequencies, problems occur which are caused by resonance phenomena on the outer conductor 36 of the coaxial line 38. Furthermore, the behaviour of the ferrite materials at relatively high frequencies is not ideal and in part undefined. For this reason, a different balun concept is preferably used for the balancing of frequencies above, for example, 4 GHz.

Figure 4:
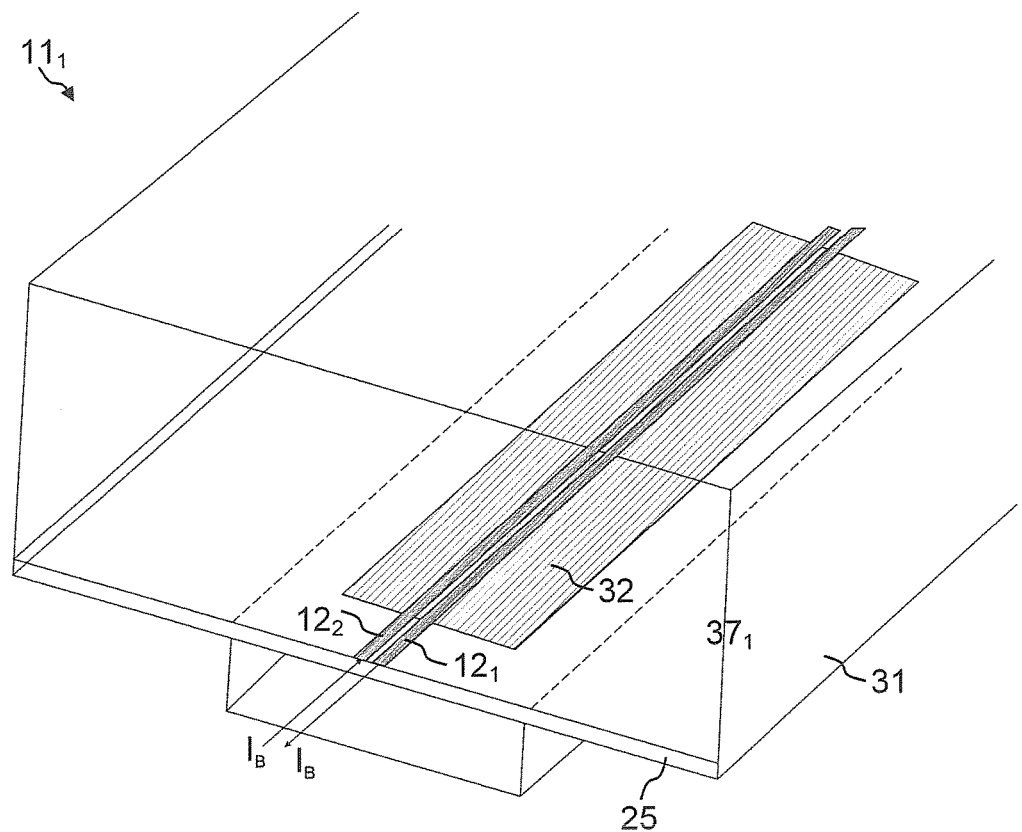
FIG. 4 an exemplary embodiment of a resistive balun.

FIG. 4 shows an exemplary embodiment of a resistive balun $11_1$, which can be used for relatively high-frequencies. The first signal line $12_1$ and the second signal line $12_2$ are clearly recognisable. These two signal lines $12_1$, $12_2$ are balanced lines which are arranged on the upper side of the substrate 25. A ground surface is arranged on the rear side of the substrate 25, wherein a resistor layer 32, which is disposed beneath the first signal line $12_1$ and the second signal line $12_2$ is embedded within the ground surface. A housing 31 also ensures that this resistive balun $11_1$ is shielded.

Figure 5:
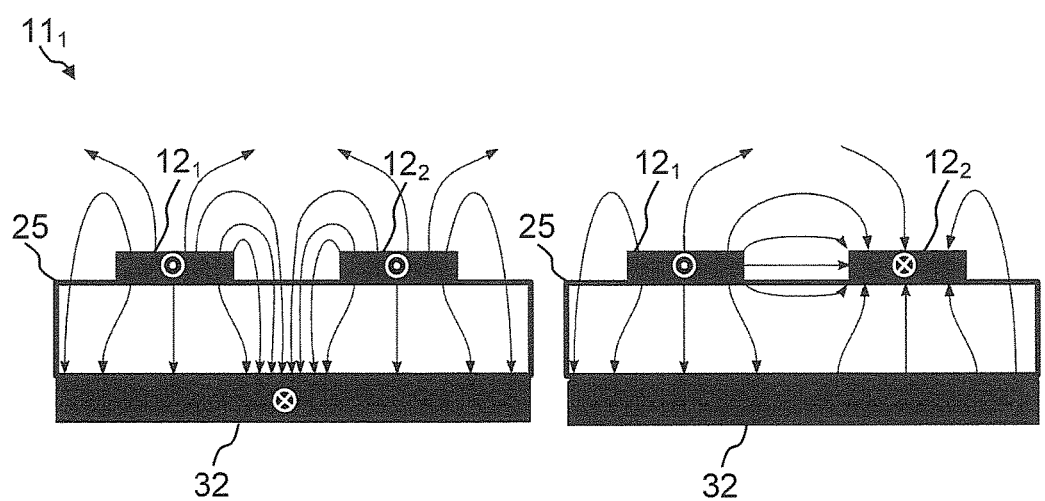
FIG. 5 a presentation which describes the field distribution for common-mode signals and odd-mode signals in a resistive balun, according to one embodiment.

FIG. 5 shows an exemplary embodiment which describes in greater detail the field distribution for common-mode signals and odd-mode signals in the resistive balun $11_1$ from FIG. 4. The left-hand drawing from FIG. 5 describes the field distribution for a common-mode signal in a resistive balun $11_1$. It is clearly evident that the current flows in the same direction in both signal lines $12_1$, $12_2$. As already explained with reference to FIG. 4, the signal lines $12_1$, $12_2$ are separated by the substrate 25 from a resistor layer 32 disposed beneath them. The substrate 25 is preferably a ceramic. The field lines of the electrical field are clearly evident. As already explained, in the case of the common-mode signal, the current flows in the same direction in both signal lines $12_1$, $12_2$. The current circuit is closed by the current in the ground surface on the rear side of the substrate. This current can be attenuated with the assistance of the resistor layer 32 on the rear side of the substrate.

By contrast, a different situation arises with an odd-mode signal, as shown in the right-hand drawing of FIG. 5. In this case, the currents in the first signal line $12_1$ and in the second signal line $12_2$ flow in a different direction. Such an odd-mode signal is only slightly influenced by the resistor layer, as shown by the field distribution of the electrical field.

Figure 6:
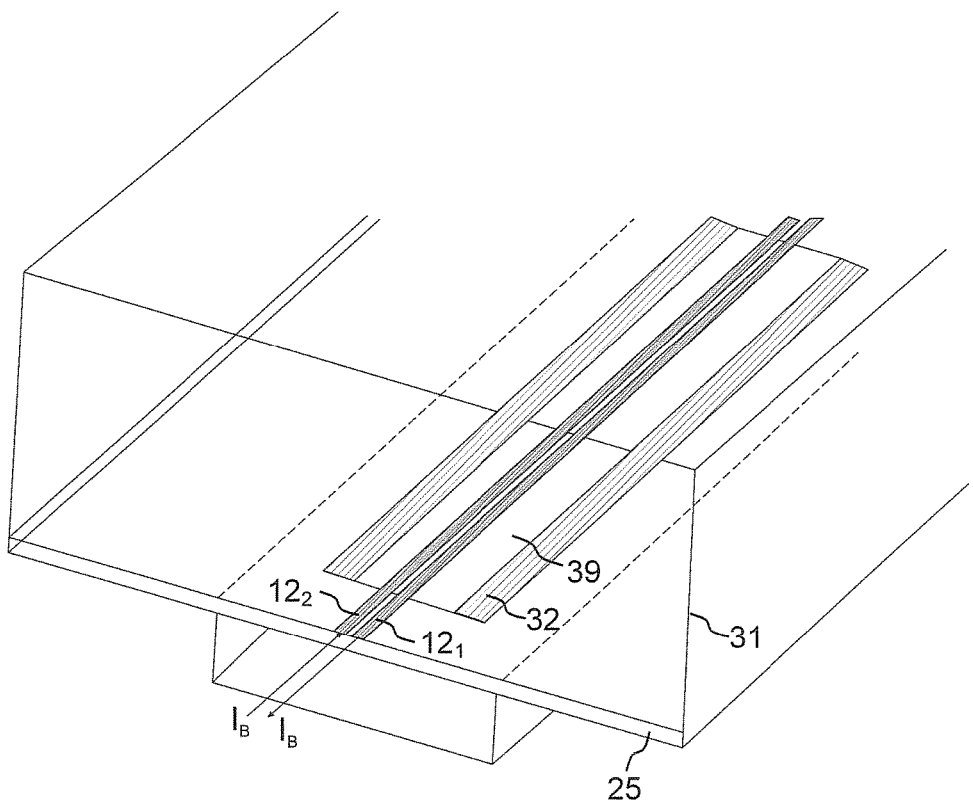
FIG. 6 an exemplary embodiment of a resistive balun with a DGS structure.

FIG. 6 shows an exemplary embodiment of a resistive balun $11_1$ with a DGS structure 39 (Defective Ground Structure). The parts of the resistor layer 32 which are disposed directly beneath the first signal line $12_1$ and the second signal line $12_2$ have been removed so that the resistor layer 32 influences the odd-mode signal even less. The DGS structure 39 splits the resistor layer 32, which is a thin-film resistor layer 32, into two mutually separate thin-film resistor layers 32, wherein the width of the DGS structure 39 is matched to the substrate material used and the frequency range to be covered, and wherein it is embodied directly between the two signal lines $12_2$, $12_2$ on the lower side of the substrate 25. In the example from FIG. 6, the width of the DGS structure 39 is significantly greater than the distance between the first signal line $12_1$ and the second signal line $12_2$.

The attenuation of the odd-mode signal can also be further reduced in that the slot width between the first signal line $12_2$ and the second signal line $12_2$ is reduced, because this concentrates the electromagnetic field in the region of the slot, and the field components in the region of the resistor layer 32 are reduced, so that the first signal line $12_1$ and the second signal line $12_2$ are disposed close together. In this context, the slot width can be selected in such a manner that it encloses a region of, for example, a few µm up to, for example, a few mm.

The use of such a DGS structure 39 means that, with an odd-mode signal, the field concentration on the resistor layer 32 is reduced, whereas, with a common-mode signal, the electromagnetic fields are concentrated at the edges of the resistor layer 32, so that the common-mode signal is attenuated significantly more strongly than the odd-mode signal.

However, for the balancing of frequencies below 4 GHz, a very long resistor layer 32, which would lead to unacceptably large losses of the odd-mode signal at high frequencies, would be required.

Figure 7:
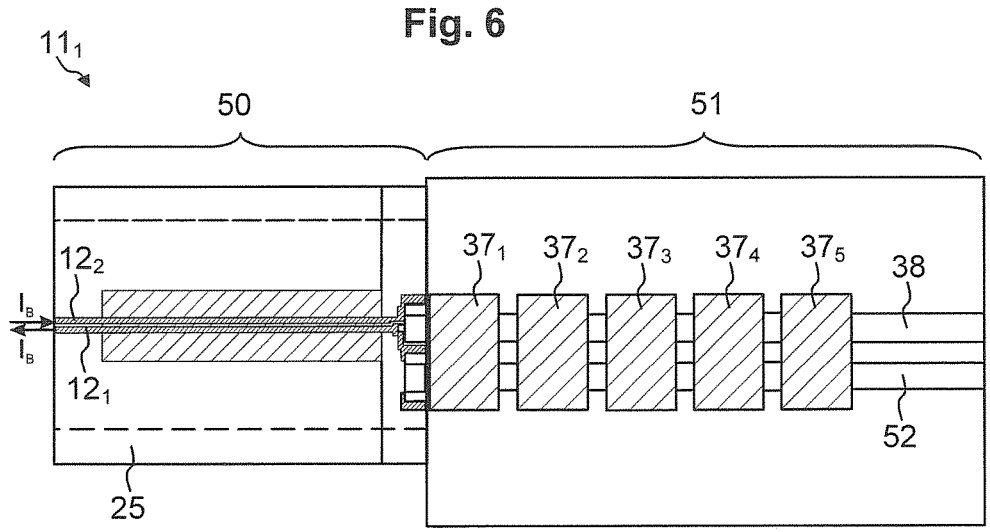
FIG. 7 an exemplary embodiment of a combination of a balun with ferrites and a compensation line and a resistive balun.

For this reason, the balun $11_1$ preferably combines the concepts from FIG. 3, FIG. 4 and FIG. 6. FIG. 7 thus shows an exemplary embodiment of a balun $11_1$, which comprises ferrites $37_1$, $37_2$, $37_3$, $37_4$, $37_5$, and also a resistive part. The balun $11_1$ comprises a first portion 50 and a second portion 51. The first portion 50 shows the construction of the resistive part as was explained with reference to FIGS. 4, 5 and 6. The second portion 51 shows the construction as explained with reference to FIG. 3. It is clearly evident that the first portion 50 comprises a substrate 25 on the upper side of which the first signal line $12_1$ and at least the one second signal line $12_2$ are guided. On the lower side of the substrate 25 in the exemplary embodiment from FIG. 7, a thin-film resistor layer 32 is embodied beneath the signal lines $12_1$, $12_2$.

As already explained, this thin-film resistor layer 32 attenuates the common-mode signal on the first and the second signal line $12_1$, $12_2$ significantly more strongly than the odd-mode signal on the two lines. The first portion 50 of the balun $11_1$ ensures that the common-mode signal is effectively suppressed for frequencies above approximately 4 GHz. As already explained, this thin-film resistor layer 32 would have to be very long in order to attenuate a low-frequency common-mode signal equally well. For this reason, the second portion 51 of the balun $11_1$ comprises a balun $11_1$ constructed in a coaxial manner, wherein the coaxial conductor 38 is surrounded by several ferrites $37_1$ to $37_5$. The inner conductor 35 of the coaxial line 38 of the second portion 51 of the balun $11_1$ is connected to the first signal line $12_1$, wherein the outer conductor 36 is connected at a first end of the coaxial line 38 to the second signal line $12_2$.

Furthermore, the second portion 51 of the balun $11_1$ optionally provides a compensation line 52 which is preferably a wire. This compensation line 52 is also connected at its first end to the first signal line $12_1$ and accordingly to the inner conductor 35 of the coaxial line 38. Because of the ferrites $37_1$ to $37_5$, the inductance of the outer conductor 36 of the coaxial line 38 is increased, whereas, in view of the coaxial construction, the inductance of the inner conductor 35 is not increased. This factual situation would lead to an unbalanced construction of the balun $11_1$ dependent upon the respective operating frequency. For this reason, the inner conductor 35 is connected to a separate compensation line 52, which is also preferably guided through the same ferrites $37_1$ to $37_5$ as the coaxial line 38. In this case, the inductance of the inner conductor 35 is increased relative to the housing ground to the same extent as the inductance of the outer conductor 36 is increased relative to the housing ground. The balun $11_1$ provides a symmetrical behaviour independently of the operating frequency.

Figure 8:
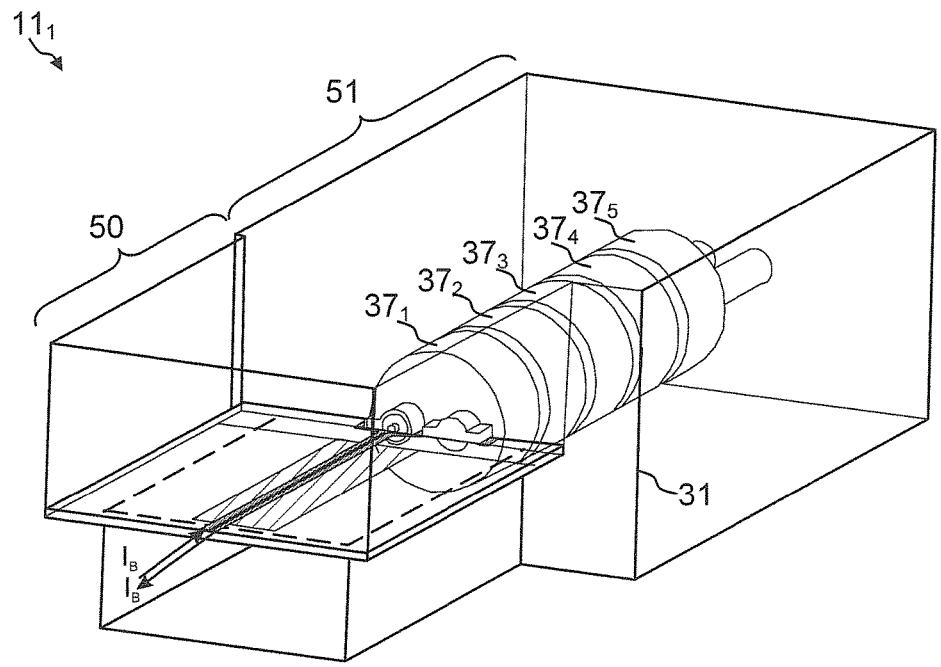
FIG. 8 an exemplary embodiment of a combination of a balun with ferrites and a compensation line and a resistive balun.

FIG. 8 shows an exemplary embodiment of a combination of a balun $11_1$ with ferrites $37_1$ to $37_5$ and a resistive balun $11_1$. By contrast with FIG. 7, which shows a plan view of an exemplary embodiment of the balun $11_1$, FIG. 8 visualises a three-dimensional view of an exemplary embodiment of the balun $11_1$. The first portion 50 and the second portion 51 are also clearly evident. The first portion 50 forms the resistive part of the balun $11_1$, whereas the second portion 51 shows the so-called "choked balun". FIG. 8 also shows the compensation line 52, which is guided through the same ferrites $37_1$ to $37_5$ as the coaxial line 38, so that the balun $11_1$ is constructed in a symmetrical manner. A housing 31 shields the balun $11_1$ from the environment.

Figure 9:
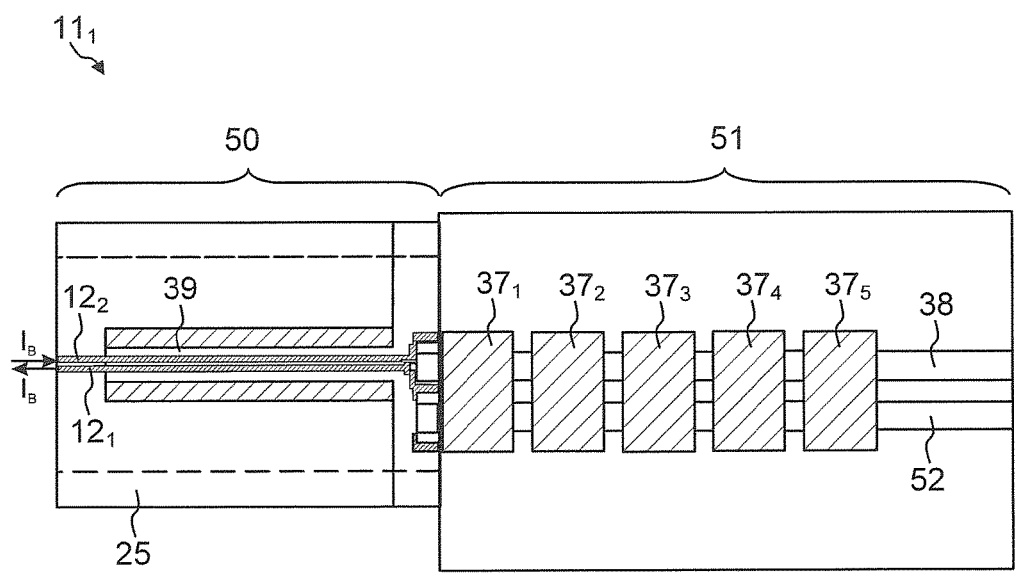
FIG. 9 a further exemplary embodiment of a combination of a balun with ferrites and compensation line and a resistive balun with a DGS structure.

FIG. 9 shows a further exemplary embodiment of a combination of a balun $11_1$ with ferrites $37_1$ to $37_5$ and a resistive balun $11_1$ with a DGS structure 39. The DGS structure 39 which ensures that the common-mode component is attenuated significantly more strongly than the odd-mode component is clearly evident. The remaining construction from FIG. 9 corresponds to that from FIG. 7, to which reference is made in this context.

Figure 10:
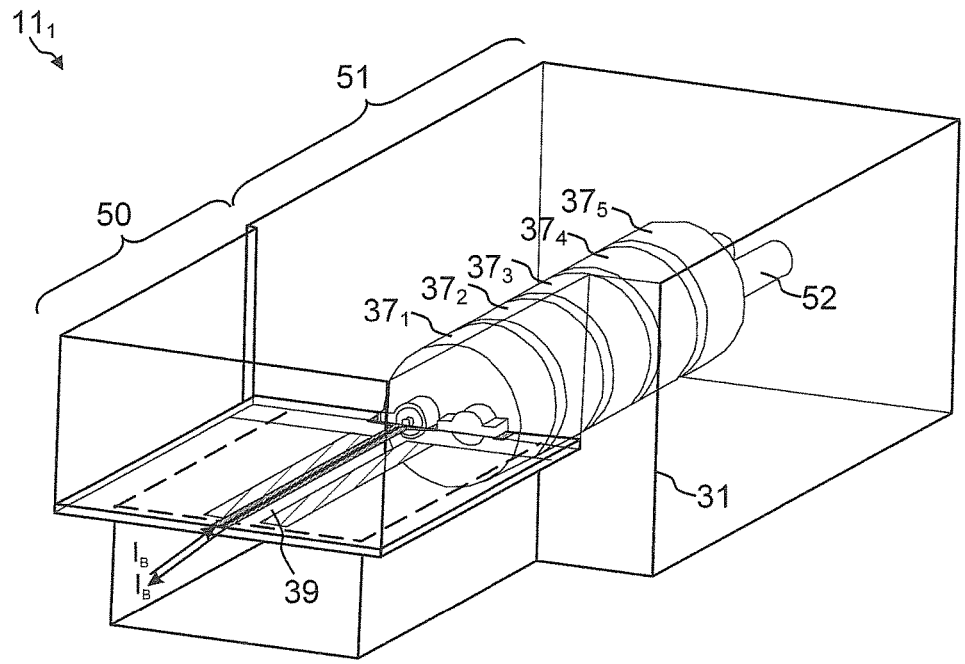
FIG. 10 an exemplary embodiment of a combination of a balun with ferrites and a compensation line and a resistive balun with a DGS structure.

FIG. 10 shows an exemplary embodiment of a combination of a balun $11_1$ with ferrites $37_1$ to $37_5$ and a compensation line 52 and a resistive balun $11_1$ with DGS structure 39. FIG. 10 shows a three-dimensional view of the balun $11_1$, whereas FIG. 9 shows a plan view of the same. The housing 31 which shields the balun $11_1$ is also clearly recognisable.

Figure 11:
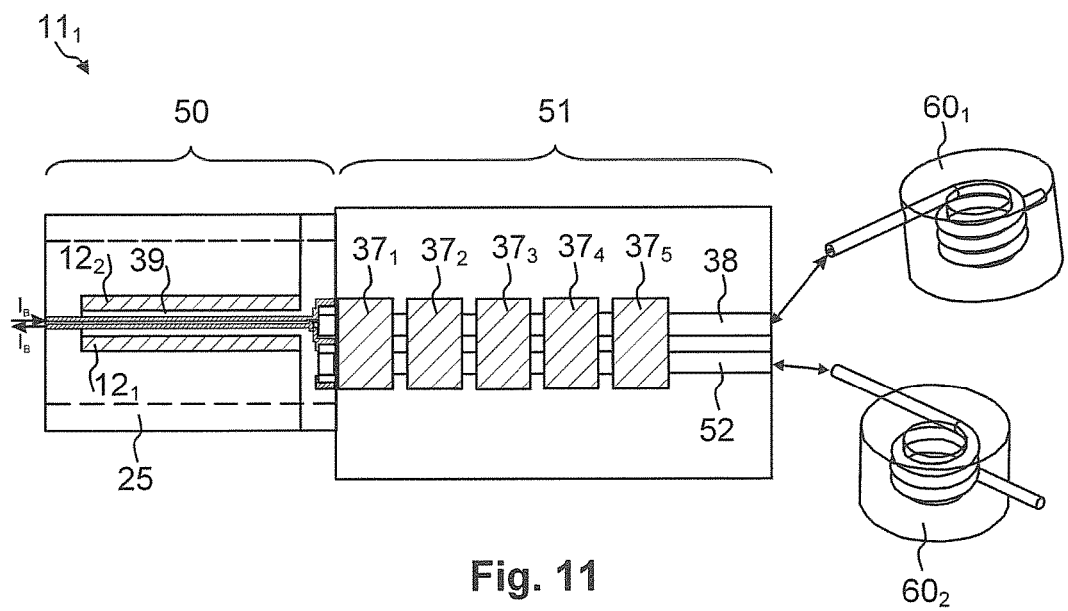
FIG. 11 an exemplary embodiment of a combination of a balun with ferrites and a compensation line and a resistive balun with a DGS structure together with cup cores.

FIG. 11 shows an exemplary embodiment of a combination of a balun $11_1$ with ferrites $37_1$ to $37_5$ and a compensation line 52 together with cup cores $60_1$, $60_2$ and a resistive balun $11_1$ with DGS structure 39. The compensation line 52 is insulated from the coaxial line 38. This can be implemented in that either the compensation line 52 and/or the coaxial line 38 is provided with a shrinkable sleeve.

Two cup cores $60_1$, $60_2$, which serve to expand the useful frequency range up to frequencies in the kHz range are clearly evident. In this context, the end of the coaxial line 38 which is distant from the first portion 50 of the balun $11_1$ is connected to a first cup core $60_1$, wherein the first cup core $60_1$ comprises a coaxial line 38 coiled within a ferrite.

Furthermore, the end of the compensation line 52, which is distant from the first portion 50 of the balun $11_1$ is connected to a second cup core $60_2$, wherein the second cup core $60_2$ comprises a line 52 coiled within a ferrite, wherein this second cup core $60_2$ provides approximately the same electrical properties as the first cup core $60_1$. By preference, the cup cores $60_1$, $60_2$ are not connected to the coaxial line 38 and the compensation line 52, but the coaxial line 38 is coiled in the first cup core $60_1$, whereas the compensation line 52 is coiled in the second cup core $60_2$.

The compensation line 52, which preferably provides an electrical insulation, is connected to the reference ground at the output of the second cup core $60_2$. The outer conductor 38 is also connected to the reference ground at the output of the first cup core $60_1$. An electronic measuring device which is not illustrated determines magnitude and phase of the voltage of the inner conductor 35 relative to the reference ground.

Figure 12:
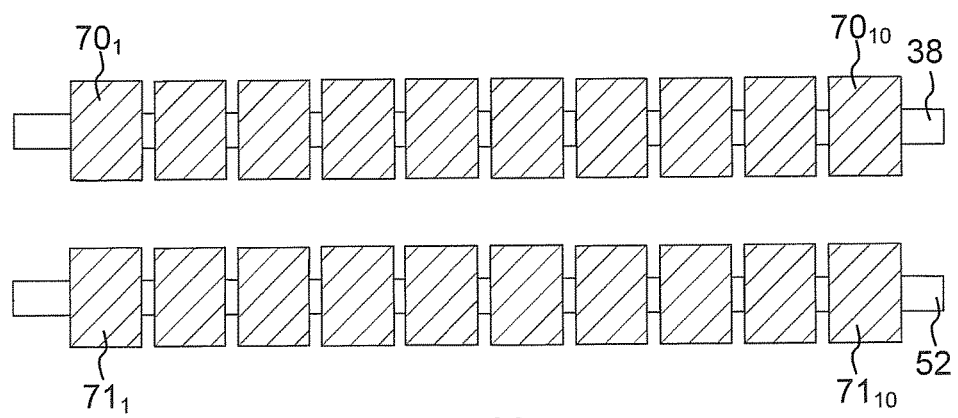
FIG. 12 an exemplary embodiment of a separated guiding of a coaxial line and a compensation line through spatially separated ferrites.

FIG. 12 shows an exemplary embodiment of a separate guiding the coaxial line 38 and a compensation line 52 through different ferrites $70_1$ to $70_{10}$ or respectively $71_1$ to $71_{10}$. In this case, the coaxial line 38 is guided through the ferrites $70_1$ to $70_{10}$, whereas the compensation line 52 is guided through the ferrites $71_1$ to $71_{10}$. The level by which the ferrites $70_1$ to $70_{10}$ increase the inductance of the outer conductor 38 should be exactly as large in this context as the level by which the ferrites $71_1$ to $71_{10}$ increase the inductance of the compensation line 52.

All the features described and/or illustrated herein can be combined arbitrarily with one another. The embodiments are not restricted to the exemplary embodiments described. For example, more than 10 ferrites or less than 10 ferrites can, of course, also be used.

The invention claimed is:

1. A measuring bridge comprising:
a first matching pad;
a second matching pad; and
a third matching pad,
wherein all matching pads comprise at least three resistors, which are arranged in a T-structure,
wherein a second resistor of the second matching pad is connected to a second resistor of the first matching pad and a third resistor of the third matching pad is connected to a third resistor of the first matching pad,
wherein a second resistor of the third matching pad is configured to be connected to a device under test,
wherein a first resistor of the second and the third matching pad are connected to two signal inputs of an element which suppresses a common-mode component on its two signal inputs, and
wherein the measuring bridge comprises a bias unit which is connected to the second resistor of the third matching pad.

2. The measuring bridge according to claim 1,
wherein a third resistor of the second matching pad is configured to be connected to a calibration standard.

3. The measuring bridge according to claim 2,
wherein the element is a balun or a differential amplifier.

4. The measuring bridge according to claim 1, wherein a first resistor of a first matching pad is configured to be connected to a signal generator and/or wherein a second resistor of the first matching pad is combined with a second resistor of the second matching pad to form a first equivalent resistor and/or wherein a third resistor of the first matching pad is combined with a third resistor of the third matching pad to form a second equivalent resistor.

5. The measuring bridge according to claim 1, wherein the resistors of the first, second and third matching pads are embodied as thin-film resistors on a substrate, and/or wherein the substrate is a ceramic or quartz substrate.

6. The measuring bridge according to claim 4,
wherein the calibration standard is formed by at least one thin-film resistor on the substrate and/or wherein a conductor track which connects the at least one calibration standard embodied as a thin-film resistor to the second matching pad provides a V-shaped recess at its end facing towards the calibration standard, which reduces a capacitive scattering field, and/or wherein the measuring bridge provides a first connector, via which the second matching pad is configured to be connected to a separate calibration standard, and
wherein the first connector provides the same electrical properties as a second connector which connects the third matching pad to the device under test.

7. The measuring bridge according to claim 2, wherein the measuring bridge comprises a dummy-bias unit which is connected to the third resistor of the second matching pad and wherein the dummy-bias unit is constructed in the same manner as the bias unit, so that the measuring bridge is symmetrical.

8. A balun comprising:
a first portion,
wherein the first portion comprises a substrate on the upper side of which a first signal line and at least one second signal line are guided, and on the lower side of which a thin-film resistor layer is embodied beneath the signal lines,
wherein the thin-film resistor layer provides a DGS structure which splits the thin-film resistor layer into two mutually separate thin-film resistor layers,
wherein the width of the DGS structure is matched to the substrate material used and the frequency range to be covered, and
wherein the DGS structure is embodied directly between the first signal line and the at least one second signal line.

9. The balun according to claim 8,
wherein the balun comprises a second portion,
wherein the second portion provides a coaxial line, of which the inner conductor is connected to the first signal line and of which the outer conductor is connected at a first end of the coaxial line to the second signal line, and
wherein at least one first ferrite surrounds the coaxial line.

10. The balun according to claim 8,
wherein the first signal line and the second signal line are arranged close to one another and/or that the substrate is a ceramic or quartz substrate.

11. The balun according to claim 8,
wherein the DGS structure is embodied directly between the two signal lines on the lower side of the substrate.

12. The balun according to claim 9,
wherein the outer conductor of the coaxial line is connected at a second end to the reference ground and/or wherein the balun provides a compensation line, of which the first end is connected to the first signal line and/or wherein the compensation line is a wire.

13. The balun according to claim 12,
wherein the compensation line together with the coaxial line is surrounded by the at least one first ferrite or that the compensation line is surrounded by at least one further ferrite,
wherein the at least one further ferrite provides the same properties as the at least one first ferrite and/or wherein a second end of the compensation line is connected to the reference ground.

14. The balun according to claim 12,
wherein the end of the coaxial line which is distant from the first portion of the balun is connected to a first cup core,
wherein the first cup core comprises a coaxial line coiled within a ferrite or wherein the coaxial line is coiled within the first cup core and/or wherein the compensation line is connected to a second cup core,
wherein the second cup core comprises a line coiled within a ferrite, or wherein the compensation line is coiled within a second cup core and
wherein the second cup core provides the same electrical properties as the first cup core.

15. The measuring bridge according to claim 1, wherein a balun according to any one of claims 8 to 14 is inserted into the measuring bridge as a common-mode suppressing element.

* * * * *